United States Patent
Walker

(10) Patent No.: US 10,092,107 B1
(45) Date of Patent: Oct. 9, 2018

(54) OUTDOOR SEATING ASSEMBLY HAVING ONE OR MORE PHOTOVOLTAIC PANELS

(71) Applicant: Mark Johns Walker, Brooklyn, NY (US)

(72) Inventor: Mark Johns Walker, Brooklyn, NY (US)

( * ) Notice: Subject to any disclaimer, the term of this patent is extended or adjusted under 35 U.S.C. 154(b) by 71 days.

(21) Appl. No.: 15/153,420

(22) Filed: May 12, 2016

Related U.S. Application Data

(60) Provisional application No. 62/161,713, filed on May 14, 2015.

(51) Int. Cl.
| | |
|---|---|
| *A47C 1/12* | (2006.01) |
| *A47C 1/16* | (2006.01) |
| *A47C 7/72* | (2006.01) |
| *H01L 31/04* | (2014.01) |
| *E04H 3/12* | (2006.01) |

(Continued)

(52) U.S. Cl.
CPC .............. *A47C 1/121* (2013.01); *A47C 1/16* (2013.01); *A47C 7/72* (2013.01); *E04H 3/12* (2013.01); *H01L 31/042* (2013.01)

(58) Field of Classification Search
CPC .. A47C 7/62; A47C 7/72; A47C 7/748; A47C 1/16; A47C 1/12; A47C 1/121; H01L 31/042; E04H 3/12
See application file for complete search history.

(56) References Cited

U.S. PATENT DOCUMENTS

| | | | | |
|---|---|---|---|---|
| 5,975,630 A * | 11/1999 | Schreiber | ................. | A47C 1/14 |
| | | | | 297/217.3 |
| 8,002,349 B1 | 8/2011 | Pizzuto | | |

(Continued)

FOREIGN PATENT DOCUMENTS

| | | | | |
|---|---|---|---|---|
| DE | 202012009621 U1 | 2/2014 | | |
| FR | 2992840 A1 * | 1/2014 | ............. | A47C 1/121 |

(Continued)

OTHER PUBLICATIONS

Green Rhino Energy, "The Principles of Photovoltaics", 2013 http://www.greenrhinoenergy.com/solar/technologies/pv_cells.php (Year: 2013).*

(Continued)

*Primary Examiner* — Ryan D Kwiecinski
(74) *Attorney, Agent, or Firm* — The Law Office of Patrick F. O'Reilly III, LLC

(57) ABSTRACT

An outdoor seating assembly is disclosed herein. The outdoor seating assembly includes a seat support structure; a seat portion coupled to the seat support structure, the seat portion configured to accommodate an individual disposed in a seated position; a seat back portion coupled to the seat support structure, the seat back portion configured to support a back of the individual; and at least one photovoltaic panel, the at least one photovoltaic panel attached to one of the seat portion and the seat back portion, the at least one photovoltaic panel geometrically conforming to a curvature of the one of the seat portion and the seat back portion. In one embodiment, at least one photovoltaic panel is coupled to the seat portion in an angularly adjustable manner. In another embodiment, at least one reflective device is provided for reflecting a portion of the solar radiation striking a seat member.

17 Claims, 15 Drawing Sheets

(51) Int. Cl.
*A47C 1/121* (2006.01)
*H01L 31/042* (2014.01)

(56) References Cited

U.S. PATENT DOCUMENTS

| | | | |
|---|---|---|---|
| 8,497,656 B2 | 7/2013 | Portis, Jr. et al. | |
| 2005/0242635 A1* | 11/2005 | Cassaday | A47C 1/022 297/217.3 |
| 2006/0244301 A1* | 11/2006 | Jeffries | A47C 1/12 297/452.55 |
| 2009/0273481 A1* | 11/2009 | Traywick | H01M 10/465 340/636.1 |
| 2010/0108113 A1 | 5/2010 | Taggart et al. | |
| 2013/0154315 A1 | 6/2013 | Kilzer | |
| 2016/0204650 A1* | 7/2016 | Hornsby | H02J 7/355 320/101 |

FOREIGN PATENT DOCUMENTS

| | | | | |
|---|---|---|---|---|
| JP | 2017065657 A | * | 4/2017 | |
| KR | 1020120071791 A | | 7/2012 | |
| KR | 1317363 B1 | * | 10/2013 | |
| WO | WO-2011004220 A1 | * | 1/2011 | ............. A47C 1/121 |

OTHER PUBLICATIONS

Machine translation of KR1317363; Oct. 13, 2017; http://engpat.kipris.or.kr/pmt/patent/patentRTT.jsp (Year: 2017).*

A. Moseman, "Sun-Powered Sundays: Solar Comes to the NFL", Popular Mechanics Online, Web page <http://www.popularmechanics.com/science/green-tech/a8001/sun-powered-sundays-solar-comes-to-the-nfl-11950423/>, 5 pages, dated Aug. 22, 2012, retrieved on Oct. 4, 2017.

* cited by examiner

DETAIL A

OUTDOOR SEATING ASSEMBLY HAVING ONE OR MORE PHOTOVOLTAIC PANELS

CROSS-REFERENCE TO RELATED APPLICATIONS

This patent application claims priority to, and incorporates by reference in its entirety, U.S. Provisional Patent Application No. 62/161,713, entitled "Outdoor Seating Assembly Having One or More Photovoltaic Panels", filed on May 14, 2015.

STATEMENT REGARDING FEDERALLY SPONSORED RESEARCH OR DEVELOPMENT

Not Applicable.

NAMES OF THE PARTIES TO A JOINT RESEARCH AGREEMENT

Not Applicable.

INCORPORATION BY REFERENCE OF MATERIAL SUBMITTED ON A COMPACT DISK

Not Applicable.

BACKGROUND OF THE INVENTION

1. Field of the Invention

The invention generally relates to an outdoor seating assembly having one or more photovoltaic panels. More particularly, the invention relates to outdoor seating assemblies that are designed to capture solar radiation striking the seat portions and/or the seat back portions of the seating assemblies so that usable energy may be generated from otherwise wasted solar radiation.

2. Background

Outdoor seating is commonly used in open-type stadiums throughout the world. Because these open-type stadiums are typically used on an intermittent basis, such as for hosting a particular sporting event, they sit empty for a vast portion of any given year. During the unoccupied times of the stadium, the outdoor seating disposed therein typically sits uncovered, and exposed to the elements (i.e., sun, rain, snow, sleet, etc.). On sunny days, when the stadium is unoccupied, a vast amount of solar radiation is absorbed by the seating of the stadium. However, because there is no means for collecting the solar radiation striking the stadium seating, the energy associated with the solar radiation is simply absorbed by the seating, and dissipated therefrom as heat. As such, a vast amount of usable solar radiation is wasted in thousands of outdoor stadiums throughout the world.

Therefore, what is needed is an outdoor seating assembly having one or more photovoltaic panels that is capable of efficiently capturing otherwise wasted solar radiation during times when the seating assembly is unoccupied. Moreover, an outdoor seating assembly is needed that comprises photovoltaic panel(s) configured to be easily integrated into existing outdoor seating assemblies so that these outdoor seating assemblies do not have to be completely redesigned to accommodate the photovoltaic panel(s) mounted thereon. Furthermore, there is a need for an outdoor seating assembly having one or more angularly adjustable photovoltaic panels that can be adjusted for solar radiation striking the photovoltaic panels at a variety of different angles.

BRIEF SUMMARY OF EMBODIMENTS OF THE INVENTION

Accordingly, the present invention is directed to an outdoor seating assembly having one or more photovoltaic panels that substantially obviates one or more problems resulting from the limitations and deficiencies of the related art.

In accordance with one or more embodiments of the present invention, there is provided an outdoor seating assembly that includes a seat support structure; a seat portion coupled to the seat support structure, the seat portion configured to accommodate an individual disposed in a seated position; a seat back portion coupled to the seat support structure, the seat back portion configured to support a back of the individual when disposed in the seated position; and at least one photovoltaic panel, the at least one photovoltaic panel attached to one of the seat portion and the seat back portion, the at least one photovoltaic panel geometrically conforming to a curvature of the one of the seat portion and the seat back portion.

In a further embodiment of the present invention, the at least one photovoltaic panel comprises one or more mounting tabs attaching the at least one photovoltaic panel to the one of the seat portion and the seat back portion.

In yet a further embodiment, each of the one or more mounting tabs comprises an aperture for receiving a fastener that affixes the at least one photovoltaic panel to the one of the seat portion and the seat back portion.

In still a further embodiment, the at least one photovoltaic panel comprises a plurality of photovoltaic panels, a first of the plurality of photovoltaic panels being attached to the seat portion of the outdoor seating assembly and a second of the plurality of photovoltaic panels being attached to the seat back portion of the outdoor seating assembly.

In yet a further embodiment, the at least one of the seat portion and the seat back portion comprises a hollow structure with a central chamber formed therein.

In still a further embodiment, the one of the seat portion and the seat back portion comprises a panel recess formed therein for accommodating a recessed mounting of the at least one photovoltaic panel.

In yet a further embodiment, the at least one photovoltaic panel comprises a photovoltaic panel subassembly with a plurality of layers adjoined to one another.

In still a further embodiment, a first of the plurality of layers comprises a clear protective coating, a second of the plurality of layers comprises a photovoltaic semiconductor layer, a third of the plurality of layers comprises an aluminum substrate layer, and a fourth of the plurality of layers comprises an adhesive layer for affixing the photovoltaic panel subassembly to the one of the seat portion and the seat back portion.

In yet a further embodiment, the seat support structure comprises a first side frame member and a second side frame member, the at least one photovoltaic panel being attached to the first side frame member by means of a first fastener, and the at least one photovoltaic panel being attached to the second side frame member by means of a second fastener.

In still a further embodiment, the at least one photovoltaic panel extends to a peripheral edge of the one of the seat portion and the seat back portion.

In yet a further embodiment, the at least one photovoltaic panel is operatively coupled to a photovoltaic power generation system, the photovoltaic power generation system comprising one or more microcontrollers configured to minimize a dissipation of solar power during times when solar radiation is generally unavailable.

In accordance with one or more other embodiments of the present invention, there is provided an outdoor seating assembly that includes a seat support structure; a seat portion coupled to the seat support structure, the seat portion configured to accommodate an individual disposed in a seated position; a seat back portion coupled to the seat support structure, the seat back portion configured to support a back of the individual when disposed in the seated position; and at least one photovoltaic panel, the at least one photovoltaic panel being coupled to the seat portion in an angularly adjustable manner so that a tilt of the at least one photovoltaic panel is capable of being selectively adjusted based upon an angular orientation of solar radiation.

In a further embodiment of the present invention, the at least one photovoltaic panel is coupled to a bottom surface of the seat portion that is opposite to a top surface of the seat portion that accommodates the individual.

In yet a further embodiment, the at least one photovoltaic panel is coupled to the seat portion by means of an elongate hinge.

In still a further embodiment, the outdoor seating assembly further comprises one or more support arms for supporting a bottom edge of the at least one photovoltaic panel.

In accordance with yet one or more other embodiments of the present invention, there is provided an outdoor seating assembly that comprises a first seat member and a second seat member. The first seat member includes a first seat support structure; a first seat portion coupled to the first seat support structure, the first seat portion configured to accommodate a first individual disposed in a seated position; a first seat back portion coupled to the first seat support structure, the first seat back portion configured to support a back of the first individual when disposed in the seated position; and at least one photovoltaic panel, the at least one photovoltaic panel attached to one of the first seat portion and the first seat back portion. The second seat member includes a second seat support structure; a second seat portion coupled to the second seat support structure, the second seat portion configured to accommodate a second individual disposed in a seated position; a second seat back portion coupled to the second seat support structure, the second seat back portion configured to support a back of the second individual when disposed in the seated position; and at least one reflective device, the at least one reflective device configured to reflect at least a portion of the solar radiation striking the second seat member towards the at least one photovoltaic panel that is attached to the one of the first seat portion and the first seat back portion.

In a further embodiment of the present invention, the at least one reflective device is disposed on the second seat back portion of the second seat member such that the reflected portion of the solar radiation comprises solar radiation striking the second seat back portion of the second seat member.

In yet a further embodiment, the at least one reflective device is disposed on a rear side of the second seat back portion of the second seat member that is opposite to a front side of the second seat back portion that is configured to support the back of the second individual.

In still a further embodiment, the reflected portion of the solar radiation striking the rear side of the second seat back portion of the second seat member is reflected towards a front side of the first seat back portion.

In yet a further embodiment, the at least one reflective device comprises one of: (i) a reflective coating on the second seat member, and (ii) a reflective panel disposed on the second seat member.

It is to be understood that the foregoing general description and the following detailed description of the present invention are merely exemplary and explanatory in nature. As such, the foregoing general description and the following detailed description of the invention should not be construed to limit the scope of the appended claims in any sense.

BRIEF DESCRIPTION OF THE SEVERAL VIEWS OF THE DRAWINGS

The invention will now be described, by way of example, with reference to the accompanying drawings, in which.

Throughout the figures, the same parts are always denoted using the same reference characters so that, as a general rule, they will only be described once.

DETAILED DESCRIPTION OF EMBODIMENTS OF THE INVENTION

Figure 1:
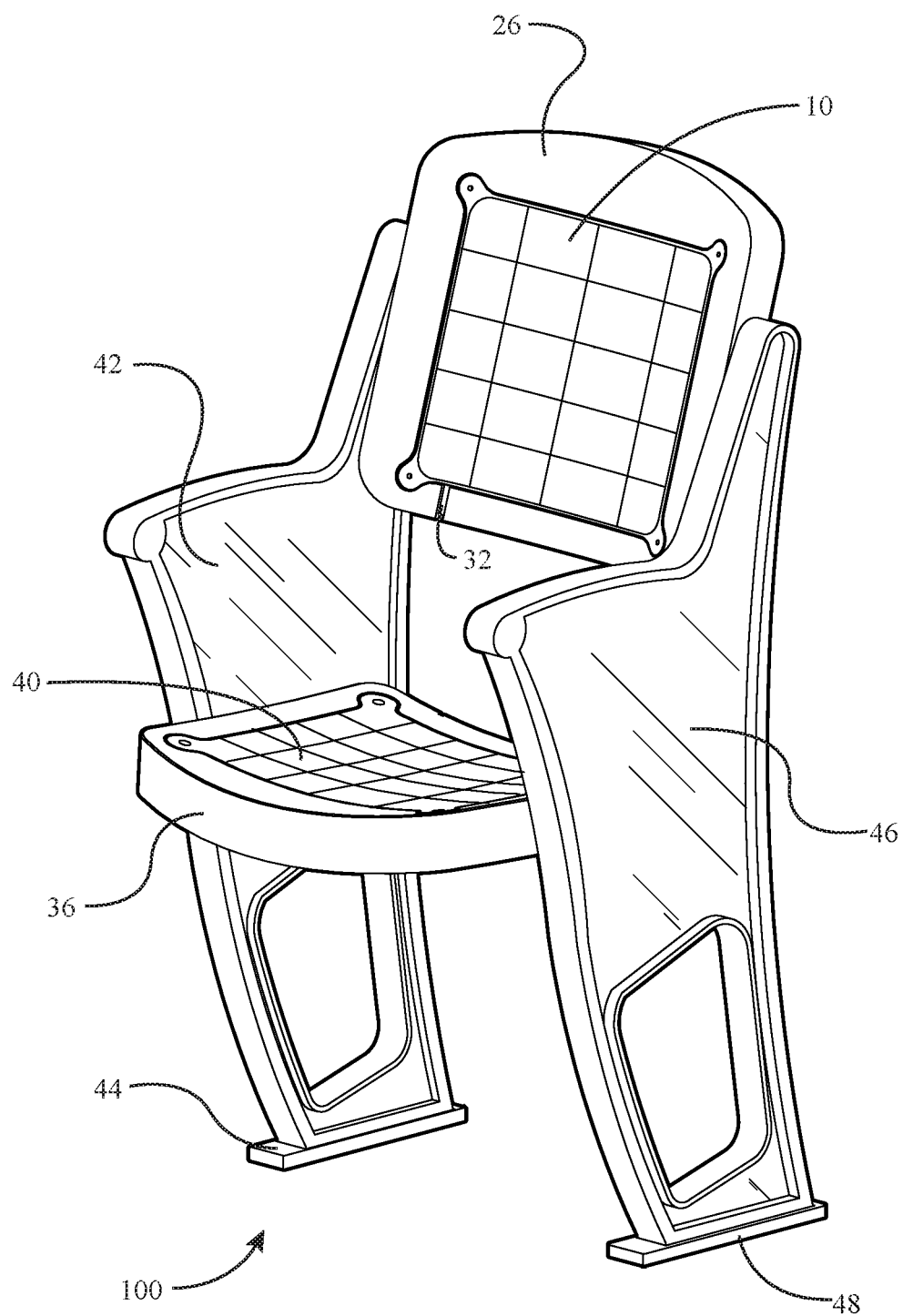
FIG. 1 is a perspective view of an outdoor seating assembly having a plurality of photovoltaic panels mounted thereon, according to a first embodiment of the invention.

A first exemplary embodiment of an outdoor seating assembly is seen generally at 100 in FIGS. 1-6. Referring initially to FIG. 1, it can be seen that the outdoor seating assembly 100 generally comprises a seat support structure (e.g., first and second side frame members 42, 46); a seat portion 36 coupled to the seat support structure 42, 46, the seat portion 36 configured to accommodate an individual disposed in a seated position; a seat back portion 26 coupled to the seat support structure 42, 46, the seat back portion 26 configured to support a back of the individual when disposed in the seated position; and a plurality of photovoltaic panels 10, 40, a first 40 of the plurality of photovoltaic panels 10, 40 being attached to the seat portion 36 of the outdoor seating assembly 100 and a second 10 of the plurality of photovoltaic panels 10, 40 being attached to the seat back portion 26 of the outdoor seating assembly 100. As shown in FIG. 1, the first photovoltaic panel 40 geometrically conforms to a curvature of the seat portion 36, while the second photovoltaic panel 10 geometrically conforms to a curvature of the seat back portion 26. As shown in FIG. 1, the outdoor seating assembly 100 is in the form of a stadium seat, which is commonly found in an outdoor stadium where sporting events are held (i.e., a baseball or football stadium). In the illustrated embodiment, the seat portion 36 of the outdoor seating assembly 100 is pivotally coupled to the seat support structure 42, 46 by means of a swivel mechanism 50 (see e.g., FIG. 8) so that the seat portion 36 is able to be pivoted upward when not in use (e.g., in the FIG. 12 position), thereby making it easier for spectators to traverse an aisle in the stadium (i.e., because the upwardly pivoted position of the seat portion 36 creates more room in the aisle).

Figure 2:
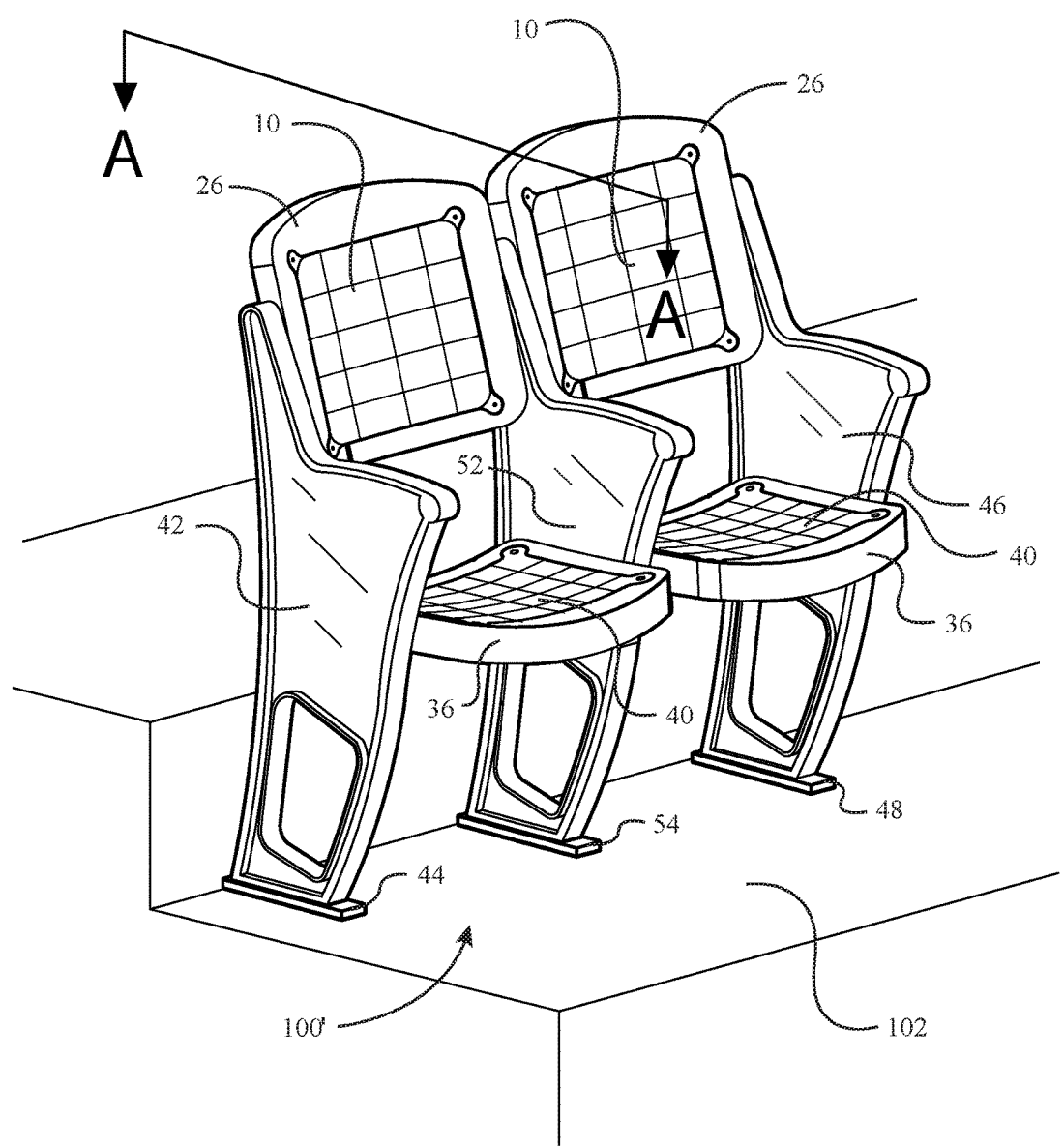
FIG. 2 is another perspective view of the outdoor seating assembly, according to the first embodiment of the invention, wherein two seats are disposed in a side-by-side relationship.

Now, referring to the illustrative embodiment of FIG. 2, it can be seen that twin outdoor seating assemblies 100' with photovoltaic panels 10, 40 provided thereon are depicted in an aisle 102 of a stadium (e.g., a baseball or football stadium). In FIG. 2, the twin outdoor seating assemblies 100' are arranged in a side-by-side seating configuration, which is a common layout for a typical outdoor stadium. A first outer side frame member 42 is provided on the leftmost side of the twin seating arrangement in FIG. 2, while a second outer side frame member 46 is provided on the rightmost side of the seating arrangement in FIG. 2. A middle side frame member 52 is provided between the seats of the twin outdoor seating assembly 100' in FIG. 2. As depicted in FIG. 2, the first outer side frame member 42 is provided with a base portion 44 disposed at the lower end thereof that is affixed to the top surface of the aisle 102. Similarly, the second outer side frame member 46 is provided with a base portion 48 disposed at the lower end thereof that is affixed to the top surface of the aisle 102. In addition, like the first and second outer side frame members 42, 46, the middle side frame 52 is provided with a base portion 54 disposed at the lower end thereof that also is affixed to the top surface of the aisle 102. Each of the base portions 44, 48, 54 of the side frame members 42, 46, 52 may be securely affixed to the top surface of the aisle 102 by means of suitable fasteners (e.g., bolts, etc.).

Figure 3:
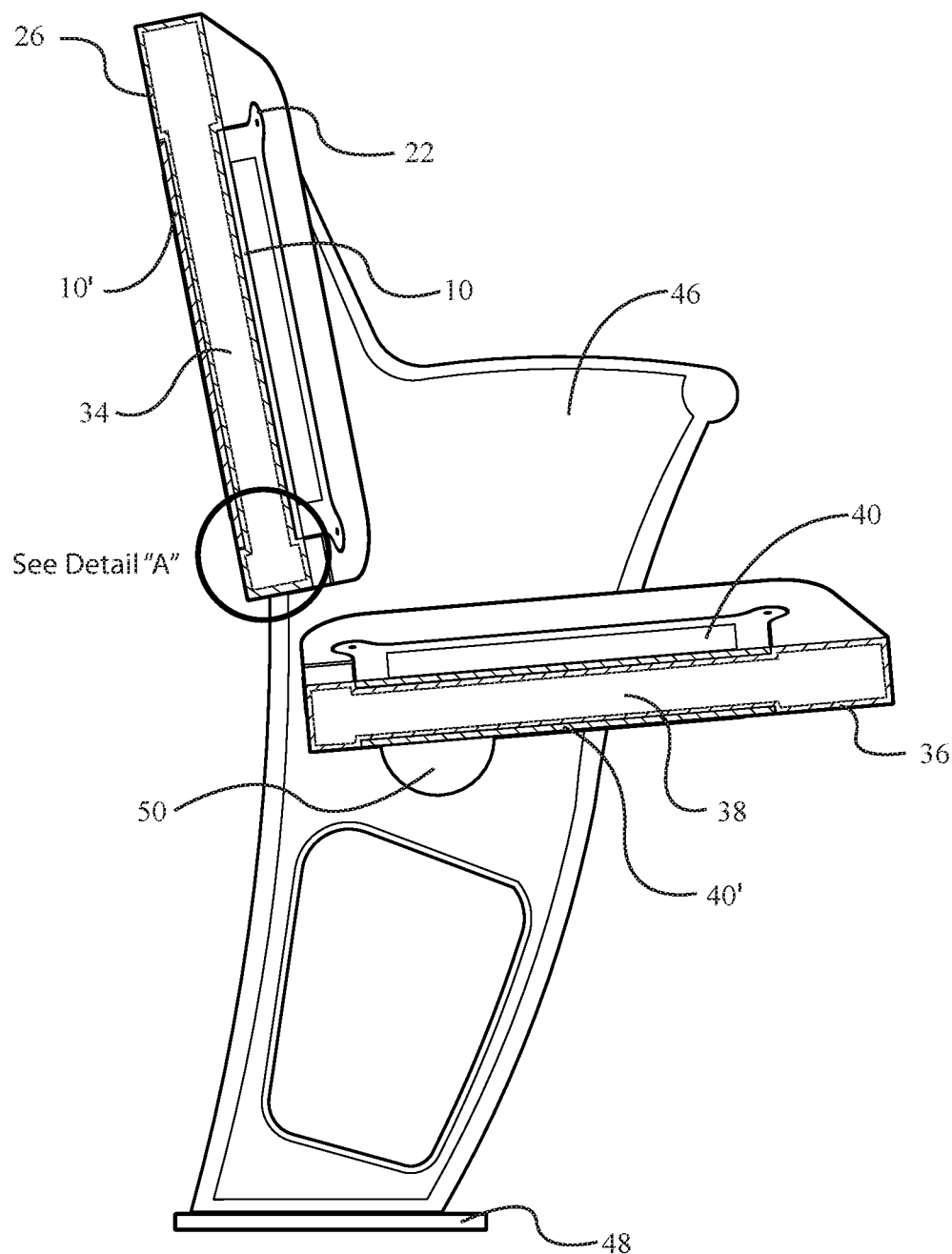
FIG. 3 is a longitudinal sectional view of the outdoor seating assembly, according to the first embodiment of the invention, wherein the sectional view is generally cut along the cutting-plane line A-A in FIG. 2.
Figure 4:
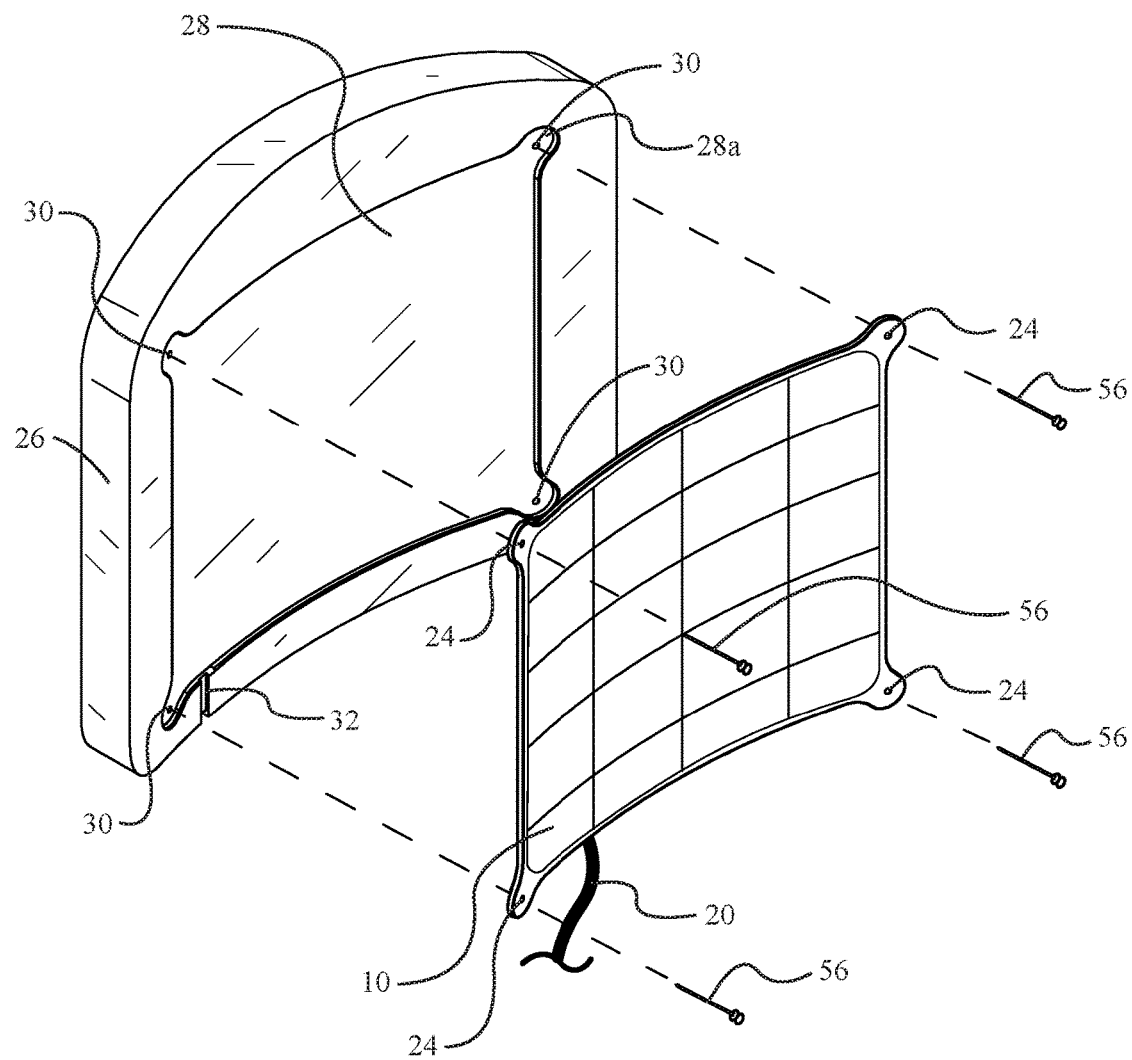
FIG. 4 is a partially exploded, front perspective view of the seat back portion of the outdoor seating assembly, according to the first embodiment of the invention.
Figure 5:
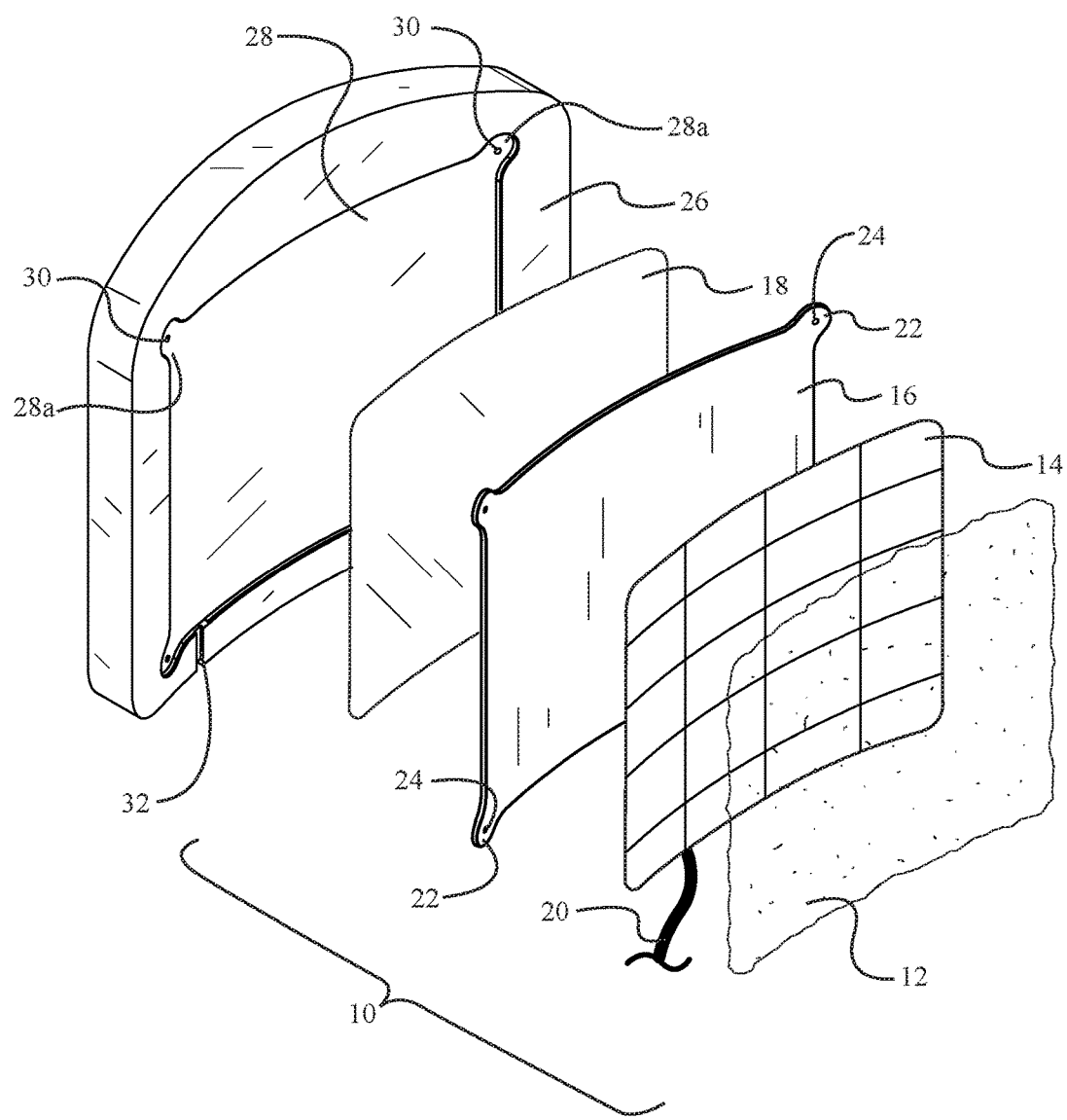
FIG. 5 is an exploded front perspective view of the seat back portion of the outdoor seating assembly illustrating the plurality of layers forming the photovoltaic panel subassembly, according to the first embodiment of the invention.
Figure 6:
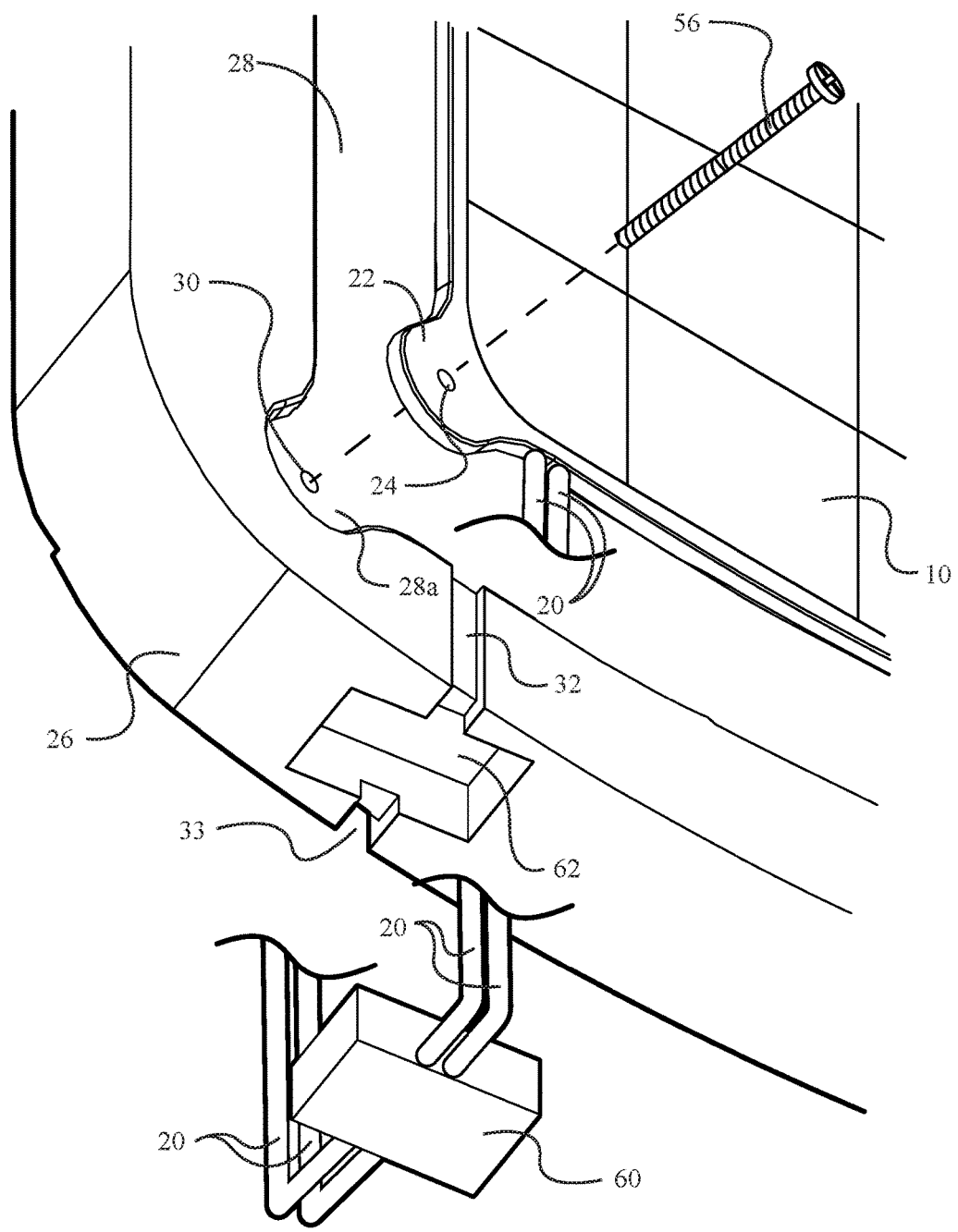
FIG. 6 is an enlarged partially exploded perspective view of a bottom corner of the seat back portion of the outdoor seating assembly illustrating the microcontroller, according to the first embodiment of the invention.

As depicted in FIGS. 1-6, each of the photovoltaic panels 10, 40 comprises a plurality of corner mounting tabs 22 attaching the photovoltaic panels 10, 40 to their respective seat back and seat portions 26, 36. In the illustrated embodiment, each of the photovoltaic panels 10, 40 has a total of four (4) corner mounting tabs 22 (i.e., one in each corner of the photovoltaic panel 10, 40). The active portions of the photovoltaic panels 10, 40 end before reaching the corner mounting tabs 22 (i.e., the corner mounting tabs 22 are not capable of collecting solar radiation). As best shown in FIGS. 4-6, each of the corner mounting tabs 22 comprises an aperture 24 disposed therethrough for receiving a fastener (e.g., bolt 56) that affixes the associated photovoltaic panel 10, 40 to either the seat portion 36 or the seat back portion 26. In the first exemplary embodiment, the photovoltaic panels 10, 40 are attached to their respective seat back and seat portions 26, 36 by means of fasteners (e.g., bolts 56) that pass through the apertures 24, 24' in the panels 10, 40 and corresponding apertures 30 in the seat back portion 26 and seat portion 36 (see e.g., FIGS. 4 and 5). In the mounting arrangement of FIGS. 4 and 5, the bolts 56 pass completely through the seat back portions 26 of the outdoor seating assemblies 100, but are not directly connected to the seat support frame member 42, 46. However, in the alternative panel mounting arrangement that will be described in the second embodiment hereinafter, the bolts 56 pass through both the seat back portions 26 and the side frame members 42', 46'.

Also, in FIGS. 4 and 5, it can be seen that the seat back portion 26 comprises a panel recess 28 formed therein for accommodating a recessed mounting of the photovoltaic panel 10. That is, the panel recess 28 enables the photovoltaic panel 10 to be flush mounted within the seat back portion 26 of the outdoor seating assembly 100 so the outer surface of the photovoltaic panel 10 is generally aligned with the outer surface of the seat back portion 26. In addition, as most clearly illustrated in FIGS. 4 and 5, it can be seen that the seat back portion 26 includes tab recess portions 28a formed therein for accommodating a recessed mounting of the corner mounting tabs 22 of the photovoltaic panel 10. The seat portion 36 of the outdoor seating assembly 100 comprises a similar panel recess for accommodating photovoltaic panel 40 in a recessed mounting arrangement so that the outer surface of the photovoltaic panel 40 is generally aligned with the outer surface of the seat portion 36. The seat portion 36 of the outdoor seating assembly 100 also includes similar tab recess portions formed therein for accommodating a recessed mounting of the corner mounting tabs of the photovoltaic panel 40. In the first embodiment, the photovoltaic panels 10, 40 are mounted to the seat and seat back portions 36, 26, but are not mounted to the seat support structure 42, 46 itself (i.e., they are affixed to the outdoor seating assembly 100 independently of the seat support structure 42, 46).

Figure 15:
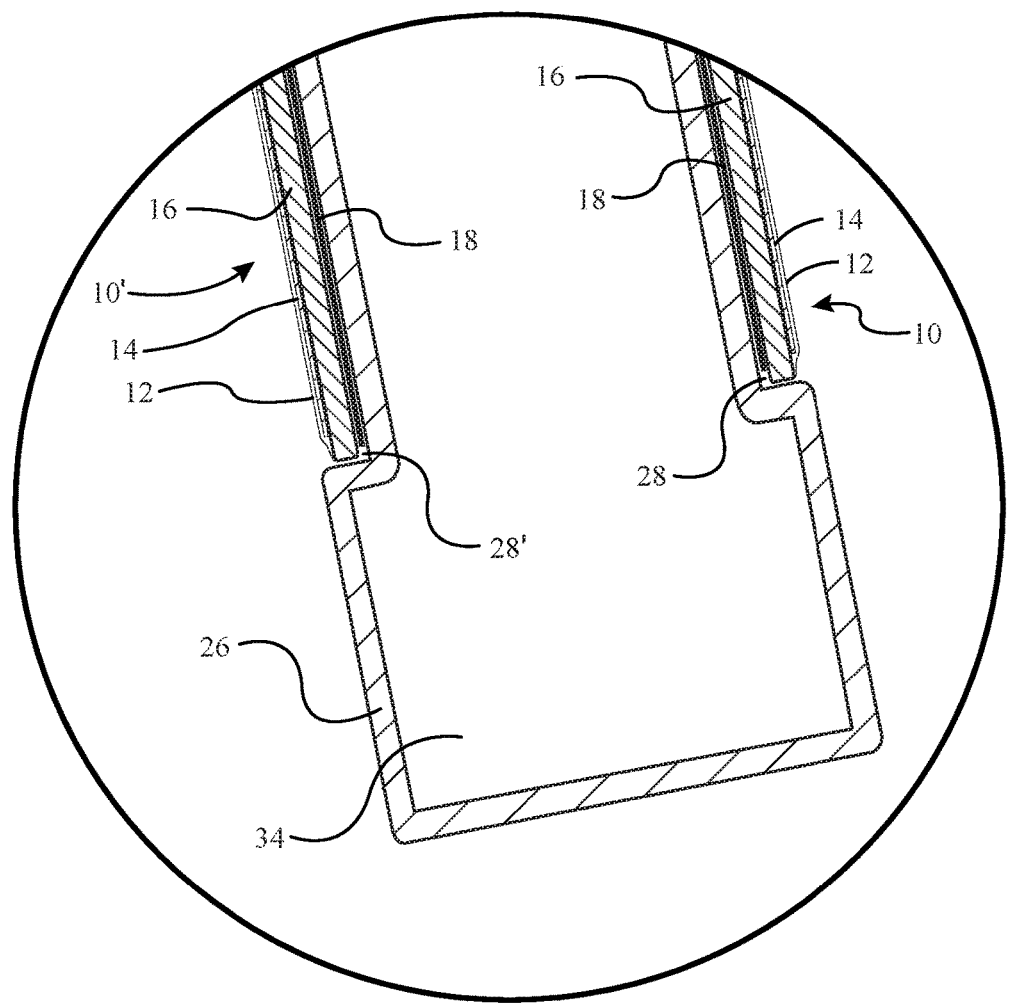
FIG. 15 is an enlarged, partial sectional view illustrating a bottom edge portion of the seat back portion of the outdoor seating assembly depicted in FIG. 3 (Detail "A"), according to the first embodiment of the invention.

Referring to FIGS. 3 and 15, it can be seen that, in the illustrated embodiment, the seat back portion 26 and the seat portion 36 are each in the form of a hollow structure with a respective central chamber 34, 38 formed therein. In an exemplary embodiment, each of the seat back portion 26 and the seat portion 36 may be blow-molded from a suitable plastic or polymeric material so as to form the blow-molded interior chambers 34, 38. Advantageously, the blow-molded construction of the seat back portion 26 and the seat portion 36 results in an outdoor seating assembly 100 that is both durable and lightweight.

With reference again to FIG. 5, in the illustrated embodiment, it can be seen that the photovoltaic panel 10 on the front of the seat back portion 26 is in the form of a photovoltaic panel subassembly with a plurality of layers 12, 14, 16, 18 adjoined to one another. The plurality of layers that form the photovoltaic panel subassembly include a clear protective coating 12 forming the top layer, an active photovoltaic semiconductor layer 14 disposed beneath the clear protective top layer 12, an aluminum substrate layer 16 disposed beneath the active photovoltaic semiconductor layer 14, and an adhesive layer 18 disposed beneath the aluminum substrate layer 16 for affixing the photovoltaic panel subassembly to the seat back portion 26 (i.e., fixing the photovoltaic panel subassembly within the recess 28 of the seat back portion 26). The photovoltaic panel 10', which may be the provided on the rear of the seat back portion 26 in panel recess 28' (see FIGS. 3 and 15), may comprise the same layers 12, 14, 16, 18 as the front photovoltaic panel 10. An enlarged detail view of the layers 12, 14, 16, 18 comprising both the front and rear photovoltaic panels 10, 10' on the front and rear of the seat back portion 26 is illustrated in FIG. 15. In FIG. 15, it can be seen that a small peripheral gap is provided around the peripheral edges of the photovoltaic panels 10, 10' so as to allow for thermal expansion. The photovoltaic panels 40, 40' on the top and bottom of the seat portion 36 of the outdoor seating assembly 100 (see FIG. 3) comprises a set of layers that are generally the same as the layers 12, 14, 16, 18 of the seat back portion 26 illustrated in FIG. 5. In an exemplary embodiment, the clear protective top layer 12 may comprise a clear coating sprayed over the active photovoltaic semiconductor layer 14. Also, in an exemplary embodiment, the active photovoltaic semiconductor layer 14 may comprise a silicon wafer layer with an embedded metal grid.

Figure 11:
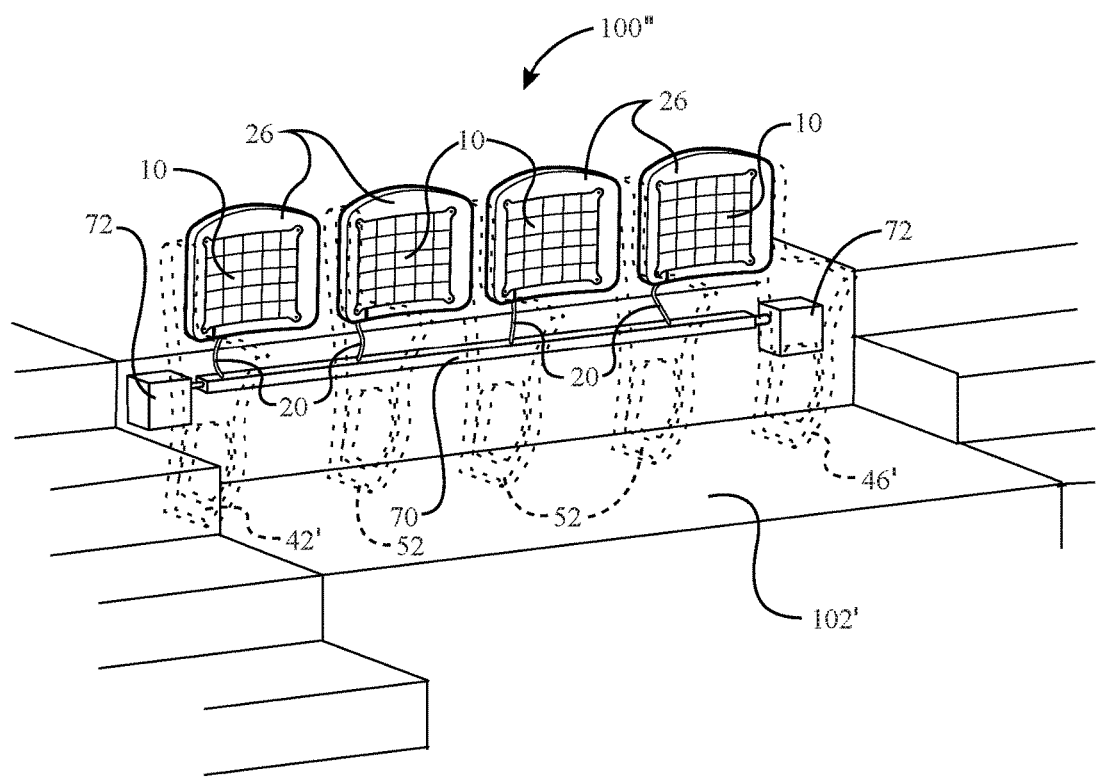
FIG. 11 is a perspective view illustrating a plurality of outdoor seating assemblies disposed in a side-by-side relationship in a single row of a stadium.

Next, referring collectively to FIGS. 4, 6, and 11, it can be seen that the photovoltaic panel 10 on the seat back portion 26 comprises electrical wiring 20 that operatively couples the photovoltaic panel 10 to a microcontroller 60, which in turn, operatively couples the photovoltaic panel 10 to a photovoltaic power generation system that comprises a large number of photovoltaic panels wired together (e.g., seat-mounted photovoltaic panels wired together in a stadium). That way, the power generated by the individual photovoltaic panels can be collectively used in conjunction with an overall power generation system (e.g., a stadium power generation system). While not explicitly shown in the drawings, it is to be understood that the photovoltaic panels 40 on the seat portions 36 of the outdoor seating assemblies 100 may also be operatively coupled to the photovoltaic power generation system in a manner similar to that illustrated for the photovoltaic panels 10. As shown in FIG. 6, the microcontroller 60, which is electrically coupled to the photovoltaic panel 10 on the seat back portion 26, may be received within a microcontroller recess 62 disposed in the bottom surface of the seat back portion 26. Advantageously, the recessed mounting of the microcontroller 60 protects the electrically sensitive microcontroller 60 from damage resulting from the harsh outdoor elements (i.e., rain, snow, sleet, etc.) that are encountered in any outdoor environment, such as in an outdoor baseball or football stadium. In one or more embodiments, the microcontrollers 60 that are mounted within the recesses 62 on the seat back portions 26 of the outdoor seating assemblies 100 minimize a dissipation of solar power during times when solar radiation is generally unavailable (e.g., on cloudy days and at night) so that the generated power is not drained from the photovoltaic system. Referring again to FIG. 6, it can be seen that the seat back portion 26 of the outdoor seating assembly 100 is provided with a wiring groove 32, 33 for accommodating the electrical wiring 20 from the photovoltaic panel 10. The first section 32 of the wiring groove is provided on the front lower edge of the seat back portion 26 and accommodates the portion of the wiring 20 connecting the photovoltaic panel 10 to the microcontroller 60, while the second section 33 of the wiring groove is provided on the bottom lower edge of the seat back portion 26 and accommodates the portion of the wiring 20 connecting the microcontroller 60 of the outdoor seating assembly 100 to the one or more other outdoor seating assemblies 100 (i.e., the adjacent outdoor seating assemblies 100) in the power generation system. The second section 33 of the wiring groove allows the electrical wiring 20 to pass behind the seat back portion 26 of the outdoor seating assembly 100 so that it can be routed in a generally concealed and inconspicuous manner to the one or more other outdoor seating assemblies 100.

Referring again to FIG. 11, it can be seen that a plurality of outdoor seating assemblies 100" are depicted in an aisle 102' of a stadium (e.g., a baseball or football stadium). In FIG. 11, the outdoor seating assemblies 100" are arranged in a generally straight row configuration, which is a common layout for a typical outdoor stadium. A first outer side frame member 42' is provided on the leftmost side of the seating arrangement in FIG. 11, while a second outer side frame member 46' is provided on the rightmost side of the seating arrangement in FIG. 11. Middle side frame members 52 are provided between each of the seats in FIG. 11. In the seating arrangement of FIG. 11, it can be seen that each of the photovoltaic panels 10 on the seat back portions 26 is wired to a common cable raceway 70 by virtue of the electrical wiring 20 connected to each individual panel 10. As such, the common cable raceway 70 carries the current flowing from each of the photovoltaic panels 10. Each opposed end of the cable raceway 70 in FIG. 11 is connected to a respective control unit or control box 72, which regulates the operation of the photovoltaic panels 10 in the illustrated stadium aisle 102'. The photovoltaic panel wiring exiting the control boxes 72 passes through the walls of the stadium (i.e., the control boxes 72 function as ports into the stadium walls, and protect the photovoltaic panel wiring from outdoor weather conditions).

A second exemplary embodiment of an outdoor seating assembly is seen generally at 200 in FIGS. 7-10. Referring to these figures, it can be seen that, in many respects, the second exemplary embodiment is similar to that of the first embodiment. Moreover, many elements are common to both such embodiments. For the sake of brevity, the elements that the second embodiment of the outdoor seating assembly has in common with the first embodiment will not be discussed because these components have already been explained in detail above. Furthermore, in the interest of clarity, these elements are denoted using the same reference characters that were used in the first embodiment.

Figure 7:
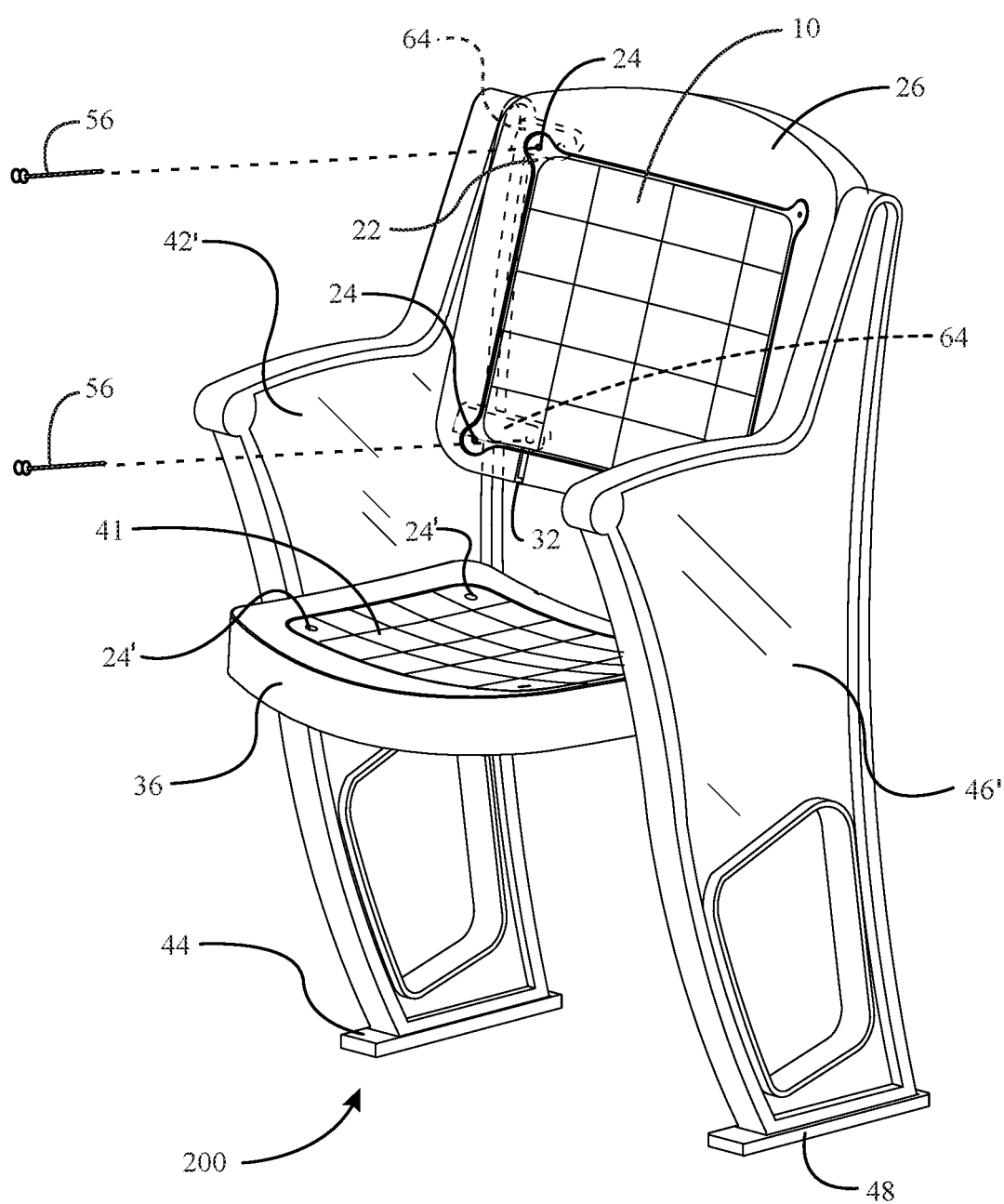
FIG. 7 is a frontal perspective view of an outdoor seating assembly having a plurality of photovoltaic panels mounted thereon, according to a second embodiment of the invention.
Figure 8:
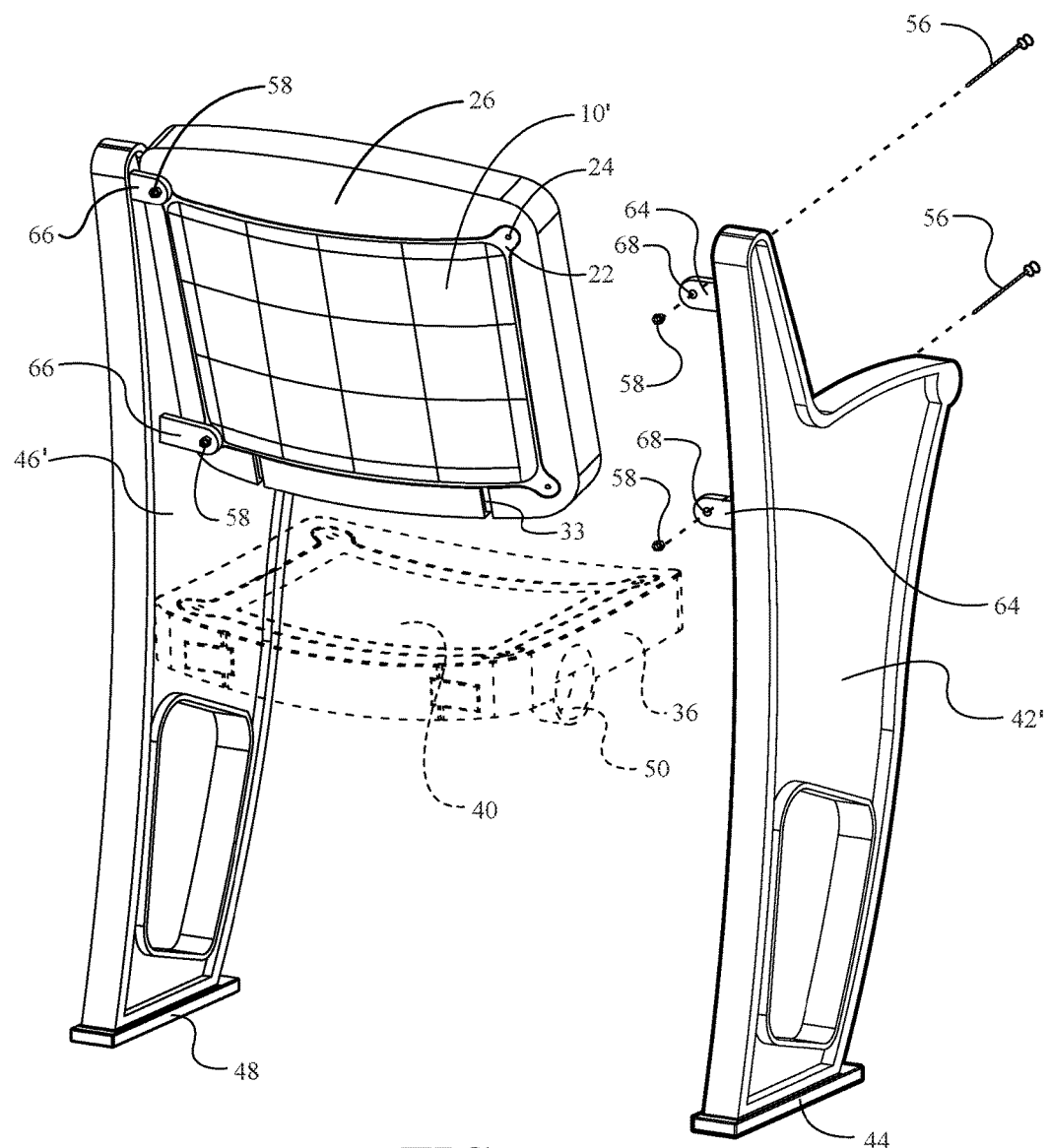
FIG. 8 is a rear perspective view of the outdoor seating assembly of FIG. 7, according to the second embodiment of the invention.

In the second exemplary embodiment, as best shown in FIGS. 7 and 8, the photovoltaic panels 10, 10' on the front and rear of the seat back portion 26 are not only mounted to the seat back portion 26 of the outdoor seating assembly 200 itself, but the photovoltaic panels 10, 10' are also mounted to the side frame members 42', 46' as well (i.e., the rigid structural portion of the outdoor seating assembly 200). In particular, as shown in FIGS. 7 and 8, the photovoltaic panels 10, 10' are directly attached to the first and second side frame members 42', 46' by means of a plurality of fasteners 56, 58 (i.e., bolts 56 with corresponding nuts 58). In FIG. 8, it can be seen that the first side frame member 42' is provided with a first pair of vertically spaced apart mounting tabs 64 with apertures 68 disposed therethrough for receiving a first pair of bolts 56. Similarly, the second side frame member 46' is provided with a second pair of vertically spaced apart mounting tabs 66 with apertures 68 disposed therethrough for receiving a second pair of bolts 56. As shown in FIG. 8, each bolt 56 passes through the panel apertures 24 in the photovoltaic panels 10, 10', the mounting aperture 30 in the seat back portion 26, and the aperture 68 in the mounting tab 64 of the side frame member 42', 46'. Each bolt 56 is secured in place by means of a respective nut 58. Advantageously, the mounting arrangement of the second illustrative embodiment allows the photovoltaic panels 10, 10' to be easily integrated into a typical stadium seating arrangement with side frame members 42', 46' having rear mounting tabs 64, 66.

Also, in the second exemplary embodiment of FIG. 7, it can be seen that the photovoltaic panel 41 that is disposed on the top surface of the seat portion 36 is slightly different than the photovoltaic panel 40 described above because, unlike the photovoltaic panel 40, the photovoltaic panel 41 does not comprise any corner mounting tabs 22. Rather, as shown in FIG. 7, the panel mounting apertures 24' are disposed through the main body portion of the photovoltaic panel 41. That is, the panel mounting apertures 24' are disposed through the active portion of the photovoltaic panel 41.

Figure 9:
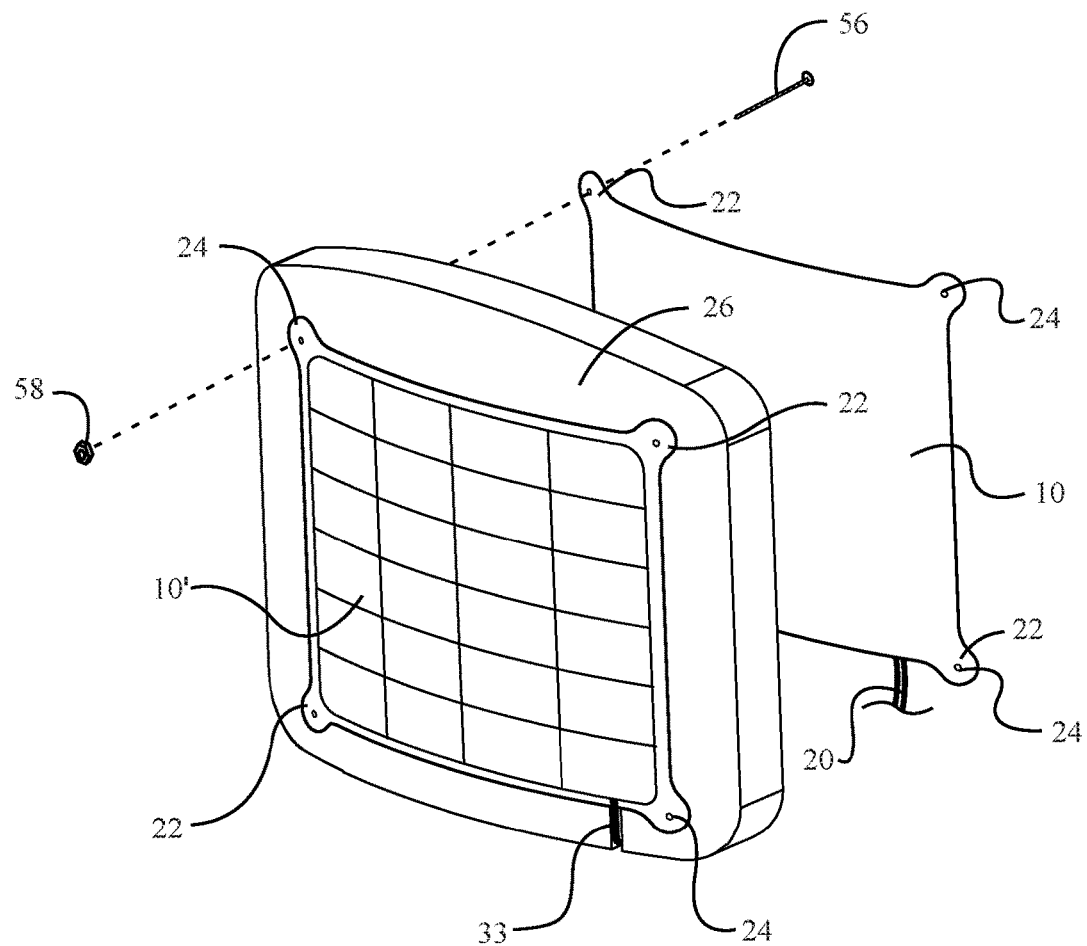
FIG. 9 is a partially exploded, rear perspective view of the seat back portion of the outdoor seating assembly, according to the second embodiment of the invention.
Figure 10:
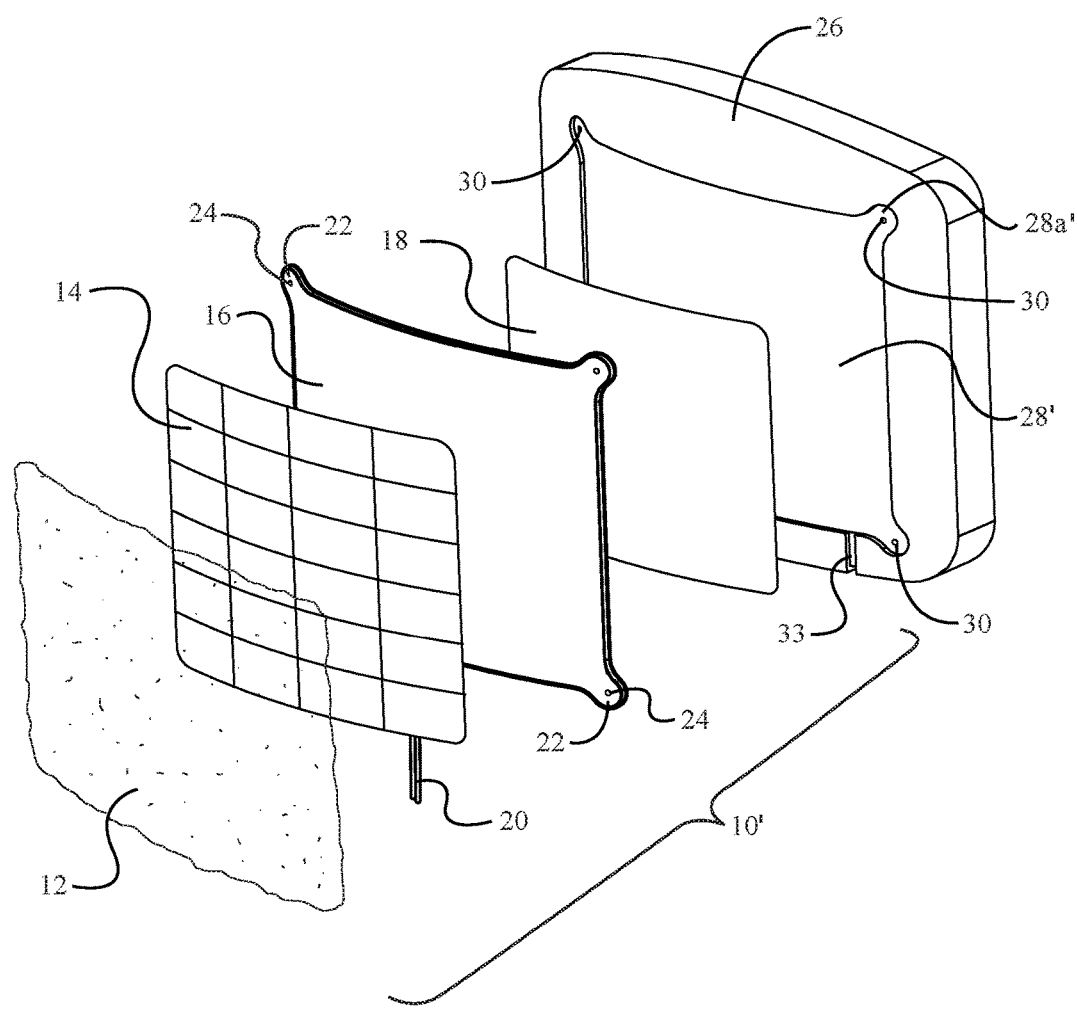
FIG. 10 is an exploded rear perspective view of the seat back portion of the outdoor seating assembly illustrating the plurality of layers forming the photovoltaic panel subassembly, according to the second embodiment of the invention.

The exploded perspective view of FIG. 10 is similar to FIG. 5 described above, except that this figure depicts the photovoltaic panel subassembly 10' that is disposed on the rear of the seat back portion 26, rather than the photovoltaic panel subassembly 10 that is disposed on the front of the seat back portion 26 of the outdoor seating assembly. Like the front photovoltaic panel subassembly 10 described above in conjunction with FIGS. 4 and 5, the rear side of the seat back portion 26 comprises a panel recess 28' formed therein for accommodating a recessed mounting of the rear photovoltaic panel 10' (see FIG. 10). That is, the panel recess 28' enables the photovoltaic panel 10' to be flush mounted within the seat back portion 26 of the outdoor seating assembly 200 so the outer surface of the photovoltaic panel 10' is generally aligned with the outer rear surface of the seat back portion 26. In addition, as illustrated in FIG. 10, it can be seen that the rear side of the seat back portion 26 includes tab recess portions 28a' formed therein for accommodating a recessed mounting of the corner mounting tabs 22 of the photovoltaic panel 10'. FIG. 9 shows that photovoltaic panels 10, 10' may be disposed on both the front and rear sides of the seat back portion 26.

In addition, like the front photovoltaic panel subassembly 10 described above in conjunction with FIGS. 4 and 5, the illustrative photovoltaic panel 10' on the rear of the seat back portion 26 is in the form of a photovoltaic panel subassembly with a plurality of layers 12, 14, 16, 18 adjoined to one another. The plurality of layers that form the photovoltaic panel subassembly include a clear protective coating 12 forming the top layer, an active photovoltaic semiconductor layer 14 disposed beneath the clear protective top layer 12, an aluminum substrate layer 16 disposed beneath the active photovoltaic semiconductor layer 14, and an adhesive layer 18 disposed beneath the aluminum substrate layer 16 for affixing the photovoltaic panel subassembly to the seat back portion 26 (i.e., fixing the photovoltaic panel subassembly within the recess 28' on the rear side the seat back portion 26). As described above, in an exemplary embodiment, the clear protective top layer 12 may comprise a clear coating sprayed over the active photovoltaic semiconductor layer 14. Also, in an exemplary embodiment, the active photovoltaic semiconductor layer 14 may comprise a silicon wafer layer with an embedded metal grid.

Figure 12:
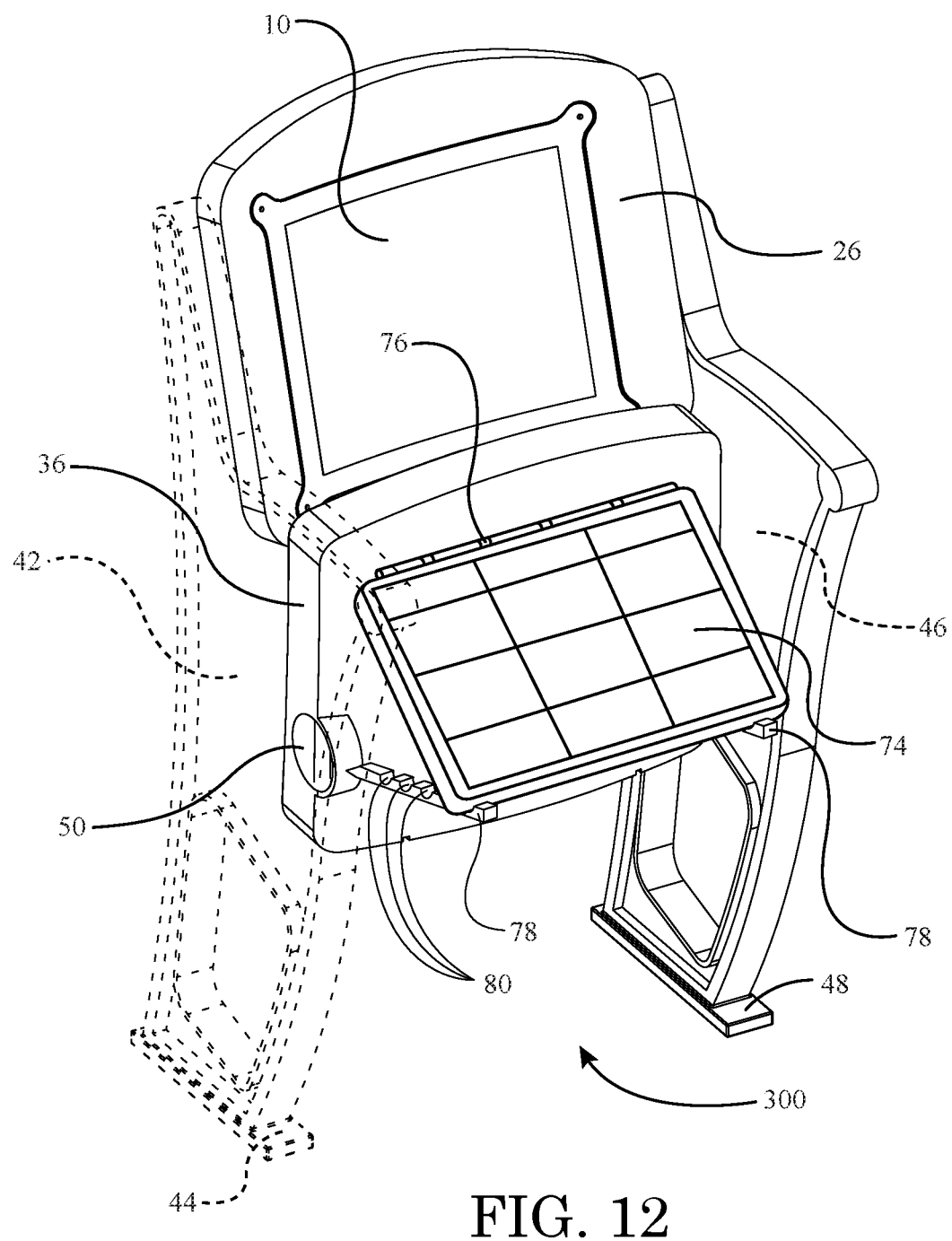
FIG. 12 is a perspective view of an outdoor seating assembly having an angularly adjustable photovoltaic panel mounted to the underside of the seat portion thereof, according to a third embodiment of the invention.

A third exemplary embodiment of an outdoor seating assembly is seen generally at 300 in FIG. 12. Referring to this figure, it can be seen that, in some respects, the third exemplary embodiment is similar to that of the preceding first and second embodiments. Moreover, some elements are common to both such embodiments. For the sake of brevity, the elements that the third embodiment of the outdoor seating assembly has in common with the first and second embodiments will only be briefly discussed, if at all, because these components have already been explained in detail above. Furthermore, in the interest of clarity, these elements are denoted using the same reference characters that were used in the first and second embodiments.

In the third exemplary embodiment, as shown in FIG. 12, the outdoor seating assembly 300 generally comprises a seat support structure 42, 46; a seat portion 36 coupled to the seat support structure 42, 46, the seat portion 36 configured to accommodate an individual disposed in a seated position; a seat back portion 26 coupled to the seat support structure 42, 46, the seat back portion 26 configured to support a back of the individual when disposed in the seated position; and a first photovoltaic panel 74 that is pivotally coupled to the seat portion 36 in an angularly adjustable manner so that a tilt of the first photovoltaic panel 74 is capable of being selectively adjusted based upon an angular orientation of solar radiation (i.e., the angle of the rays emanating from the sun). In addition, as illustrated in the embodiment of FIG. 12, the outdoor seating assembly 300 also includes a second photovoltaic panel 10 mounted in a stationary manner on the front side of the seat back portion 26. The pivotable photovoltaic panel 74 of FIG. 12 is designed to be used when the seat portion 36 is not occupied (i.e., when an individual is not disposed in the seat).

Referring again to FIG. 12, it can be seen that the pivotable photovoltaic panel 74 is rotatably coupled to a bottom surface or underside of the seat portion 36, which is opposite to a top surface of the seat portion 36 that accommodates the individual. As shown in FIG. 12, the upper edge of pivotable photovoltaic panel 74 is rotatably coupled to the underside of the seat portion 36 by means of an elongate hinge 76 (e.g., a piano hinge). The lower edge of pivotable photovoltaic panel 74 is supported by a pair of spaced-apart support arms 78. One end of each of the spaced-apart support arms 78 is attached to the underside of the seat portion 36. Each of the spaced-apart support arms 78 extends in a cantilevered manner from the underside of the seat portion 36. Also, as shown in FIG. 12, each of the spaced-apart support arms 78 comprises a plurality of notches 80 spaced apart along the length thereof so that the tilt angle of the photovoltaic panel 74 may be selectively adjusted by engaging the lower edge of the photovoltaic panel 74 in selected ones of the notches 80 in each of the support arms 78 (i.e., in selected aligned notches 80 in each of the support arms 78). In FIG. 12, the lower edge of the photovoltaic panel 74 is disposed in the outermost notches 80 of each of support arms 78 so as to maximize the tilt angle of the photovoltaic panel 74 relative to the bottom surface of the seat portion 36. If the lower edge of the photovoltaic panel 74 is engaged with the innermost set of notches 80 on the support arms 78, rather than the outermost set of notches 80 on the support arms 78 as in FIG. 12, then the tilt angle of the photovoltaic panel 74 relative to the bottom surface of the seat portion 36 will be minimized. As such, by virtue of the adjustability afforded by the pivotal mounting of the photovoltaic panel 74 in FIG. 12, the photovoltaic panel 74 is capable of being disposed at an optimal orientation angle for capturing sunlight.

While the pivotable photovoltaic panel 74 is provided with a discrete means of adjustability in the illustrated embodiment of FIG. 12, it is to be understood that the pivotable photovoltaic panel 74 may alternatively be provided with a generally continuous means of adjustability, such as that provided with a linear slide mechanism and associated locking means. If the pivotable photovoltaic panel 74 is provided with a continuous means of adjustability, the photovoltaic panel 74 is capable of being disposed at any tilt angle within a specified angular range (e.g., 10 to 45 degrees, inclusive).

Figure 13:
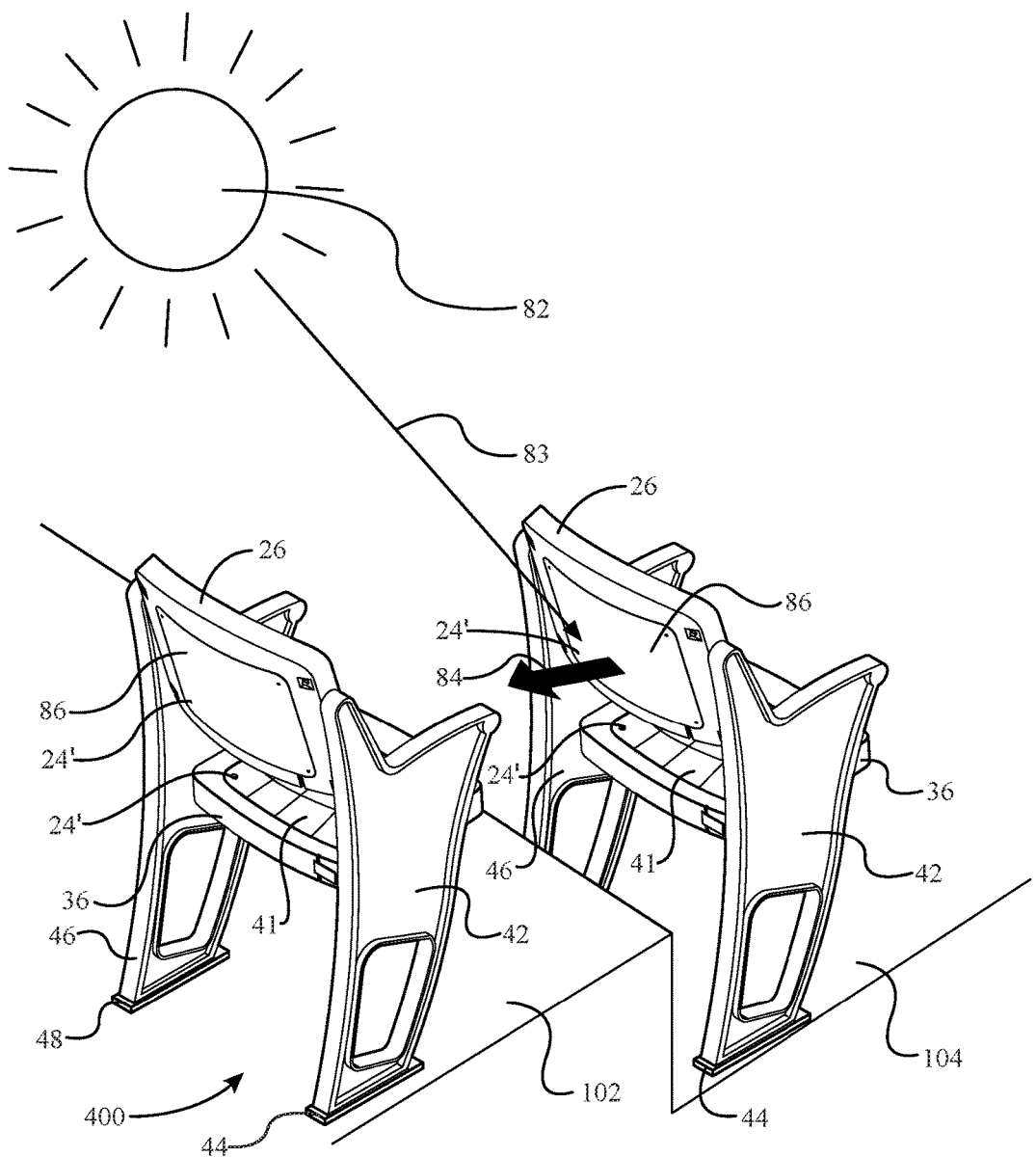
FIG. 13 is a perspective view illustrating an outdoor seating assembly with seat members disposed in two different rows of a stadium, according to a fourth embodiment of the invention, wherein solar radiation striking one of the seat members is reflected onto the other of the seat members by means of a reflective device.

A fourth exemplary embodiment of an outdoor seating assembly is seen generally at 400 in FIG. 13. Referring to this figure, it can be seen that, in some respects, the fourth exemplary embodiment is similar to that of the preceding three embodiments. Moreover, some elements are common to all of these embodiments. For the sake of brevity, the elements that the fourth embodiment of the outdoor seating assembly has in common with the first three embodiments will only be briefly discussed, if at all, because these components have already been explained in detail above. Furthermore, in the interest of clarity, these elements are denoted using the same reference characters that were used in the first, second, and third embodiments.

In the fourth exemplary embodiment, as shown in FIG. 13, the outdoor seating assembly 400 generally comprises a first seat member disposed in a first stadium aisle 102 and a second seat member disposed in a second stadium aisle 104. In FIG. 13, the second seat member in the second stadium aisle 104 is disposed in front of, and at a lower elevation than the first seat member in the first stadium aisle 102 (i.e., the second stadium aisle 104 is stepped down from the first stadium aisle 102). Referring again to FIG. 13, it can be seen that the first seat member includes a first seat support structure 42, 46; a first seat portion 36 coupled to the first seat support structure 42, 46, the first seat portion 36 configured to accommodate a first individual disposed in a seated position; a first seat back portion 26 coupled to the first seat support structure 42, 46, the first seat back portion 26 configured to support a back of the first individual when disposed in the seated position; and a plurality of photovoltaic panels 41 (e.g., a first photovoltaic panel attached to the front of the seat back portion 26 and a second photovoltaic panel attached to the top of the seat portion 36). Similarly, in FIG. 13, the second seat member includes a second seat support structure 42, 46; a second seat portion 36 coupled to the second seat support structure 42, 46, the second seat portion 36 configured to accommodate a second individual disposed in a seated position; a second seat back portion 26 coupled to the second seat support structure 42, 46, the second seat back portion 26 configured to support a back of the second individual when disposed in the seated position; and a reflective device 86 configured to reflect at least a portion of the solar radiation striking the second seat member towards at least one photovoltaic panel on the first seat member.

With reference again to FIG. 13, it can be seen that the reflective device 86 is disposed on the second seat back portion 26 of the second seat member such that the reflected portion of the solar radiation (as diagrammatically indicated by the arrow 84 in FIG. 13) comprises solar radiation striking the second seat back portion 26 of the second seat member. In particular, the reflective device 86 is disposed on a rear side of the second seat back portion 26 of the second seat member that is opposite to a front side of the second seat back portion 26 that is configured to support the back of the second individual. As shown in FIG. 13, the reflected portion 84 of the solar rays 83 emanating from the sun 82 strikes the reflective device 86 on the rear side of the second seat back portion 26 of the second seat member, and is reflected towards a front side of the first seat back portion, which comprises a photovoltaic panel 10 mounted thereon so that the reflected solar radiation 84 may be collected and converted into usable energy by the photovoltaic power generation system of the stadium. In FIG. 13, it can be seen that the rear side of the first seat back portion 26 of the first seat member may also be provided with a reflective device 86 disposed thereon for reflecting solar radiation to the photovoltaic panel(s) provided on the seat behind the first seat member. Similarly, each seat in the stadium, which has a seat disposed therebehind, may be provided with a reflective device 86 thereon to reflect a portion of the solar radiation striking the seat to the seat located therebehind.

In one or more embodiments, the reflective devices 86 may comprise one or more of the following: (i) reflective coatings on the seat back portions 26 of the seat members, and (ii) reflective panels or layers disposed on the seat back portions 26 of the second seat members. For example, the reflective devices 86 may comprise mirror-like coatings sprayed on the rear side of the seat back portions 26 of the seat members.

Figure 14:
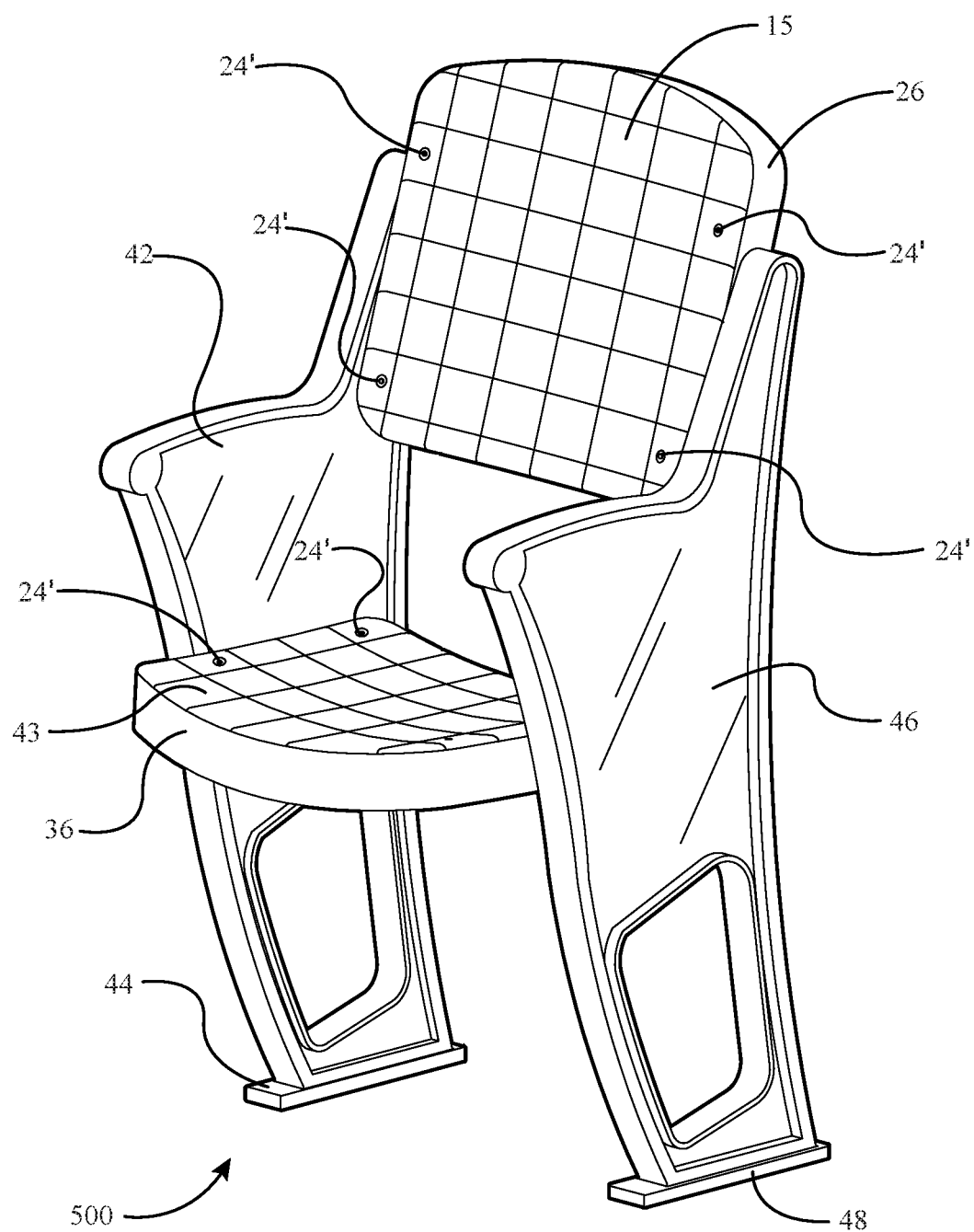
FIG. 14 is a perspective view of an outdoor seating assembly having a plurality of photovoltaic panels mounted thereon, according to a fifth embodiment of the invention, wherein each of the plurality of photovoltaic panels extend to the peripheral outer edges of the seat portion and seat back portion of the outdoor seating assembly.

A fifth exemplary embodiment of an outdoor seating assembly is seen generally at 500 in FIG. 14. Referring to this figure, it can be seen that, in some respects, the fifth exemplary embodiment is similar to that of the preceding four embodiments. Moreover, some elements are common to all of these embodiments. For the sake of brevity, the elements that the fifth embodiment of the outdoor seating assembly has in common with the first four embodiments will not be discussed because these components have already been explained in detail above. Furthermore, in the interest of clarity, these elements are denoted using the same reference characters that were used in the first, second, third, and fourth embodiments.

In the fifth exemplary embodiment, as shown in FIG. 14, the outdoor seating assembly 500 generally comprises photovoltaic panels 15, 43 that extend completely to the peripheral edges of the seat back portion 26 and the seat portion 36 on which they are respectively disposed. That is, unlike the seat and seat back portions that were described in the first four embodiments above, the seat portion 36 and the seat back portion 26 of the fifth embodiment do not comprise peripheral borders that are disposed around the photovoltaic panels. Rather, as shown in FIG. 14, the photovoltaic panel 15 occupies the entire front surface of the seat back portion 26, and the photovoltaic panel 43 occupies the entire top surface of the seat portion 36. As such, the active photovoltaic panel surface area is maximized, thereby resulting in a maximum amount of potential power generation. In the fifth embodiment of FIG. 14, the mounting apertures 24', which are used for accommodating fasteners that secure the photovoltaic panels 15, 43 to their respective seat back and seat portions 26, 36, are even disposed through the active portion of the photovoltaic panels 15, 43 (i.e., the bolts are disposed through the active panels themselves). In the embodiment of FIG. 14, because the photovoltaic panels 15, 43 extend to the outermost edges of the seat and seat back surfaces, the entire seat and seat back portions 36, 26 of the outdoor seating assembly 500 may be sprayed with a protective clear coating.

In one or more embodiments, the photovoltaic panels 10, 10', 15, 40, 40', 41, 43, 74 described in conjunction with the embodiments above may be capable of absorbing, and generating electricity from both ultraviolet radiation and infrared radiation. As such, the power generated by the photovoltaic panels 10, 10', 15, 40, 40', 41, 43, 74 may be maximized.

In an alternative embodiment, the outdoor seating assembly may comprise a non-folding type stadium seat, which comprises a photovoltaic panel that is attached to both the seat portion and the seat back portion of the non-folding type stadium seat. For example, in this alternative embodiment, the photovoltaic panel may comprise a first portion that is attached to the seat portion and a second portion that is attached to the seat back portion, wherein the first portion of the photovoltaic panel is oriented approximately perpendicularly to the second portion of the photovoltaic panel. In this alternative embodiment, the photovoltaic panel may extend continuously between the seat portion and the seat back portion of the non-folding type stadium seat (i.e., the photovoltaic panel may comprise a corner section at the junction between seat portion and the seat back portion of the seat, which connects the first and second portions of the photovoltaic panel together).

It is readily apparent that the aforedescribed outdoor seating assemblies 100, 200, 300, 400, and 500, which comprise one or more photovoltaic panels, offer numerous advantages. First, the outdoor seating assemblies 100, 200, 300, 400, and 500 with one or more photovoltaic panels are capable of efficiently capturing otherwise wasted solar radiation during times when the seating assemblies are unoccupied. Secondly, the outdoor seating assemblies 100, 200, 300, 400, and 500 comprise photovoltaic panel(s) that are configured to be easily integrated into the most widely used seat and seat back structures of outdoor seating assemblies so that the seat and seat back structures do not have to be completely redesigned to accommodate the photovoltaic panel(s) mounted thereon. Finally, one or more of the outdoor seating assemblies 100, 200, 300, 400, and 500 comprise an angularly adjustable photovoltaic panel that can be adjusted for solar radiation striking the photovoltaic panels at a variety of different angles.

Any of the features or attributes of the above described embodiments and variations can be used in combination with any of the other features and attributes of the above described embodiments and variations as desired.

Although the invention has been shown and described with respect to a certain embodiment or embodiments, it is apparent that this invention can be embodied in many different forms and that many other modifications and variations are possible without departing from the spirit and scope of this invention.

Moreover, while exemplary embodiments have been described herein, one of ordinary skill in the art will readily appreciate that the exemplary embodiments set forth above are merely illustrative in nature and should not be construed as to limit the claims in any manner. Rather, the scope of the invention is defined only by the appended claims and their equivalents, and not, by the preceding description.

The invention claimed is:

1. An outdoor seating assembly, comprising:
a seat support structure;
a seat portion pivotally coupled to said seat support structure, said seat portion having a top surface and a bottom surface oppositely disposed relative to said top surface, said top surface of said seat portion configured to accommodate an individual disposed in a seated position;
a seat back portion coupled to said seat support structure, said seat back portion configured to support a back of said individual when disposed in said seated position; and
at least one photovoltaic panel, said at least one photovoltaic panel attached to said top surface of said seat portion, said at least one photovoltaic panel geometrically conforming to a curvature of said seat portion.

2. The outdoor seating assembly according to claim 1, wherein said at least one photovoltaic panel comprises one or more mounting tabs attaching said at least one photovoltaic panel to said top surface of said seat portion, each of said one or more mounting tabs extending outwardly from a peripheral edge of said at least one photovoltaic panel at the same curvature as a solar collecting surface of said at least one photovoltaic panel.

3. The outdoor seating assembly according to claim 2, wherein each of said one or more mounting tabs comprises an aperture for receiving a fastener that affixes said at least one photovoltaic panel to said top surface of said seat portion.

4. The outdoor seating assembly according to claim 1, wherein said at least one photovoltaic panel comprises a plurality of photovoltaic panels, a first of said plurality of photovoltaic panels being attached to said top surface of said seat portion of said outdoor seating assembly and a second of said plurality of photovoltaic panels being attached to said seat back portion of said outdoor seating assembly.

5. The outdoor seating assembly according to claim 4, wherein said seat support structure comprises a first side frame member with at least one first tab member and a second side frame member with at least one second tab member, said second of said plurality of photovoltaic panels being attached to said at least one first tab member of said first side frame member by means of a first fastener, and said second of said plurality of photovoltaic panels being attached to said at least one second tab member of said second side frame member by means of a second fastener.

6. The outdoor sealing assembly according to claim 4, wherein said seat back portion has a front surface and a rear surface oppositely disposed relative to said front surface, and wherein said second of said plurality of photovoltaic panels is attached to said rear surface of said seat back portion of said outdoor seating assembly.

7. The outdoor seating assembly according to claim 1, wherein at least one of said seat portion and said seat back portion comprises a hollow structure with a central chamber formed therein.

8. The outdoor seating assembly according to claim 1, wherein said seat portion comprises a panel recess formed therein for accommodating a recessed mounting of said at least one photovoltaic panel.

9. The outdoor seating assembly according to claim 1, wherein said at least one photovoltaic panel comprises a photovoltaic panel subassembly with a plurality of layers adjoined to one another.

10. The outdoor seating assembly according to claim 9, wherein a first of said plurality of layers comprises a clear protective coating, a second of said plurality of layers comprises a photovoltaic semiconductor layer, a third of said plurality of layers comprises a substrate layer, and a fourth of said plurality of layers comprises an adhesive layer for affixing said photovoltaic panel subassembly to said seat portion.

11. The outdoor seating assembly according to claim 1, wherein said at least one photovoltaic panel extends to a peripheral edge of said seat portion.

12. The outdoor seating assembly according to claim 1, wherein said at least one photovoltaic panel is operatively coupled to a photovoltaic power generation system, said photovoltaic power generation system comprising one or more microcontrollers configured to minimize a dissipation of solar power during times when solar radiation is generally unavailable.

13. An outdoor seating assembly, comprising:
a seat support structure;
a seat portion coupled to said seat support structure, said seat portion configured to accommodate an individual disposed in a seated position;
a seat back portion coupled to said seat support structure, said seat back portion configured to support a back of said individual when disposed in said seated position; and
at least one photovoltaic panel, said at least one photovoltaic panel attached to one of said seat portion and said seat back portion, said at least one photovoltaic panel geometrically conforming to a curvature of said one of said seat portion and said seat back portion, said at least one photovoltaic panel comprising one or more mounting tabs attaching said at least one photovoltaic panel to said one of said seat portion and said seat back portion, each of said one or more mounting tabs extending outwardly from a peripheral edge of said at least one photovoltaic panel at the same curvature as a solar collecting surface of said at least one photovoltaic panel.

14. The outdoor seating assembly according to claim 13, wherein each of said one or more mounting tabs comprises an aperture for receiving a fastener that affixes said at least one photovoltaic panel to said one of said seat portion and said seat back portion.

15. The outdoor seating assembly according to claim 13, wherein said at least one photovoltaic panel comprises a plurality of photovoltaic panels, a first of said plurality of photovoltaic panels being attached to said seat portion of said outdoor seating assembly and a second of said plurality of photovoltaic panels being attached to said seat back portion of said outdoor seating assembly.

16. The outdoor seating assembly according to claim 15, wherein said seat portion has a top surface and a bottom surface oppositely disposed relative to said top surface, and wherein a first of said plurality of photovoltaic panels is attached to said top surface of said seat portion of said outdoor seating assembly.

17. The outdoor seating assembly according to claim 15, wherein said seat support structure comprises a first side frame member with at least one first tab member and a second side frame member with at least one second tab member, said second of said plurality of photovoltaic panels being attached to said at least one first tab member of said first side frame member by means of a first fastener, and said second of said plurality of photovoltaic panels being attached to said at least one second tab member of said second side frame member by means of a second fastener.

* * * * *